US009810402B2

(12) United States Patent
Park et al.

(10) Patent No.: US 9,810,402 B2
(45) Date of Patent: Nov. 7, 2017

(54) LIGHT CONVERSION SUBSTRATE AND LIGHT EMITTING PACKAGE AND AUTOMOBILE LAMP INCLUDING THE SAME

(71) Applicant: LG INNOTEK CO., LTD., Seoul (KR)

(72) Inventors: Jin Gyeong Park, Seoul (KR); Won Jin Kim, Seoul (KR); In Jae Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 134 days.

(21) Appl. No.: 14/621,924

(22) Filed: Feb. 13, 2015

(65) Prior Publication Data
US 2015/0233546 A1 Aug. 20, 2015

(30) Foreign Application Priority Data
Feb. 14, 2014 (KR) .................. 10-2014-0017320

(51) Int. Cl.
*F21S 8/10* (2006.01)
*F21V 9/16* (2006.01)
*F21V 9/08* (2006.01)

(52) U.S. Cl.
CPC ............. *F21V 9/16* (2013.01); *F21S 48/1159* (2013.01); *F21S 48/1163* (2013.01); *F21S 48/13* (2013.01); *F21V 9/08* (2013.01)

(58) Field of Classification Search
CPC . F21V 9/16; F21V 9/08; F21S 48/1159; F21S 48/1163; F21S 48/13; H01L 33/50; H01L 33/507; H01L 33/06; H01L 33/40; H01L 33/504; H01L 33/60; H01L 24/05; H01L 33/0095; H01L 33/382;
(Continued)

(56) References Cited

U.S. PATENT DOCUMENTS

2004/0145308 A1\* 7/2004 Rossner .................. C04B 35/44
313/512
2007/0085103 A1\* 4/2007 Nishioka ............... H01L 33/507
257/99

(Continued)

FOREIGN PATENT DOCUMENTS

| EP | 1 753 035 A1 | 2/2007 |
| EP | 2 346 101 A1 | 7/2011 |
| EP | 2 669 964 A2 | 12/2013 |

OTHER PUBLICATIONS

European Search Report issued in Application No. 15154866.6 dated May 27, 2015.

*Primary Examiner* — Elmito Breval
*Assistant Examiner* — Fatima Farokhrooz
(74) *Attorney, Agent, or Firm* — KED & Associates, LLP

(57) ABSTRACT

Provided are a light conversion substrate intended for converting an excited beam into a conversion beam, and a light emitting package including the light conversion substrate, the light conversion substrate being implemented in a structure in which side parts of the light conversion substrate for converting a beam emitted from a light emitting element are formed to have different tapers so that uniform color distribution can be implemented all over the entire surface of the light conversion substrate upon packaging the light conversion substrate with the light emitting element.

11 Claims, 16 Drawing Sheets

(58) Field of Classification Search
CPC ........... H01L 33/505; H01L 2933/0041; H01L 2224/48091; H01L 2924/00014
See application file for complete search history.

(56) References Cited

U.S. PATENT DOCUMENTS

| | | | |
|---|---|---|---|
| 2010/0110553 A1* | 5/2010 | Anderson | B60R 1/088 359/603 |
| 2010/0313414 A1* | 12/2010 | Sheats | B23K 20/004 29/829 |
| 2011/0284902 A1* | 11/2011 | Daicho | H01L 33/505 257/98 |
| 2012/0113617 A1 | 5/2012 | Kelso et al. | |
| 2013/0292710 A1* | 11/2013 | Kim | H01L 33/50 257/88 |
| 2013/0313581 A1* | 11/2013 | Furuyama | H01L 33/505 257/88 |
| 2016/0079488 A1* | 3/2016 | Burger | H01L 33/505 257/98 |

* cited by examiner

FIG. 2
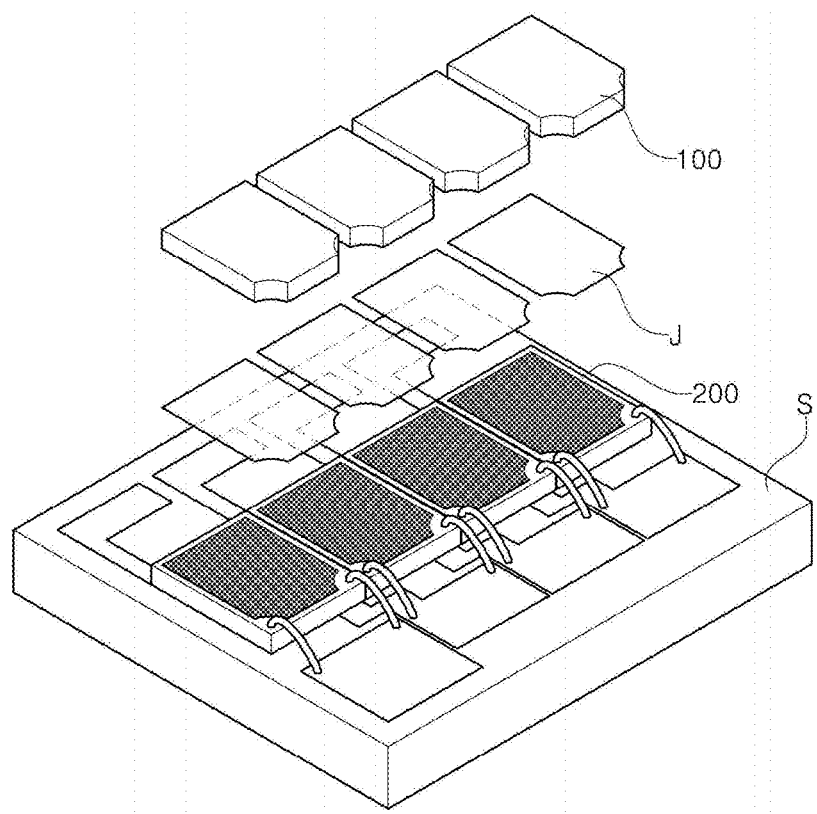
(a)
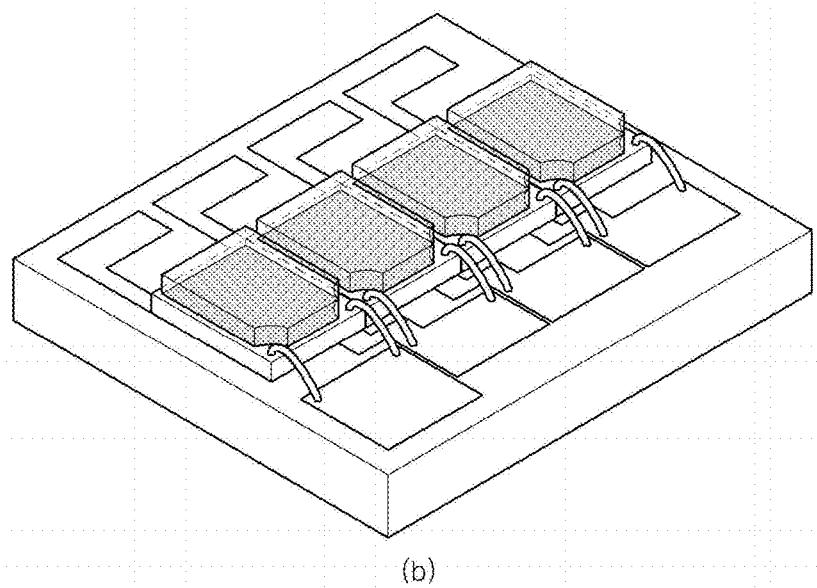
(b)

FIG. 7
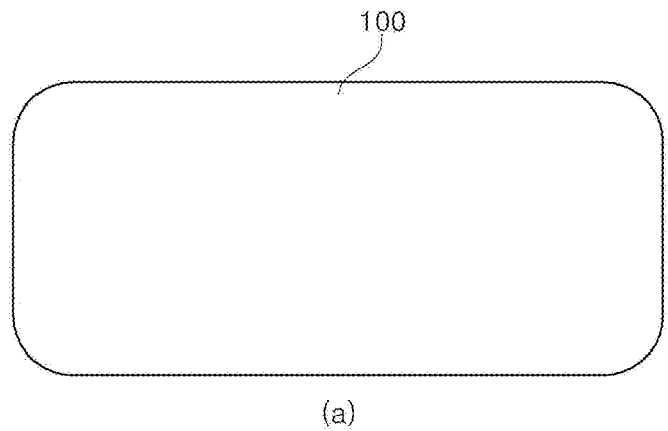
(a)
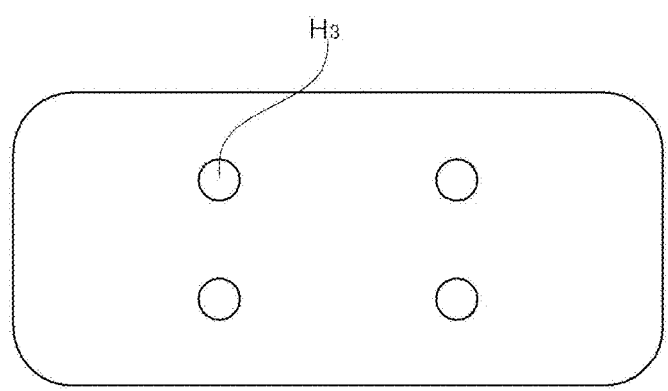
(b)
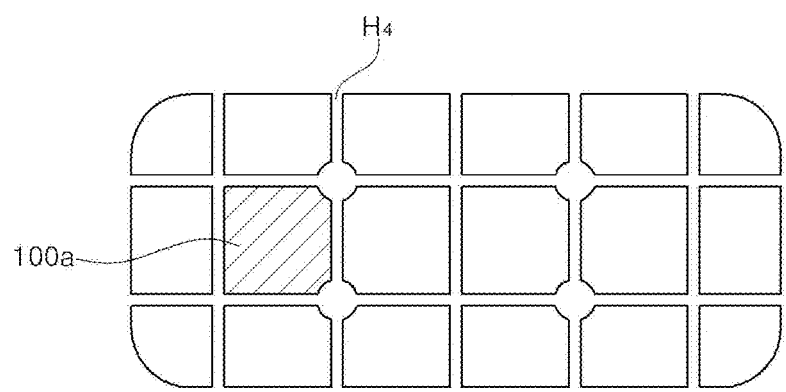
(c)

LIGHT CONVERSION SUBSTRATE AND LIGHT EMITTING PACKAGE AND AUTOMOBILE LAMP INCLUDING THE SAME

CROSS-REFERENCE TO RELATED APPLICATION

This application claims priority under 35 U.S.C. §119 to Korean Application No. 10-2014-0017320 filed on Feb. 14, 2014, in the Korean Intellectual Property Office, whose entire disclosure is hereby incorporated by reference.

BACKGROUND

1. Field

Embodiments of the present disclosure relate to a substrate intended for converting excited light into conversion light, and a package including the substrate.

2. Background

As the market for electric cars and hybrid electric cars has been enlarged, the development of low power and high efficiency light sources for a car has been actively carried out. However, the low power and high efficiency light sources may cause the problem of a reduction in reliability because a low wavelength light source emitting a beam in a relatively thin spectrum width is used with a phosphor, and thus the beam should be converted into a white beam for actual use of the light source, and degradation and decomposition of the phosphor is generated by the high temperature/high integration and low wavelength beam during the converting process.

In order to solve this problem, there is a need to research a phosphor that enables the light source and the phosphor to be disposed to be spaced apart from each other.

In particular, when a lighting device is implemented by packaging the lighting device with a light emitting element such as an LED and the like, a substrate member containing a phosphor is processed to correspond to a light emitting region of the light emitting element, thereby performing packaging using a bonding method and the like. A wire bonding portion of the light emitting element is left hollow by piercing holes in the substrate member.

However, since the substrate member containing such a phosphor is formed by mixing a material in a resin form with a fluorescent material, high electric currents may be applied to a light emitting element and thus the light emitting element may be driven when the substrate member is processed in a desired size and shape. In this case, thermal strain or a crack is generated, thereby causing a large problem of the reduction in reliability.

In order to secure a thermal property, when a ceramic material is applied as the substrate member, it is difficult to process the substrate member due to a property of the ceramic material. In particular, it is more difficult to process fine patterns of a wire bonding portion with a light emitting element and the like.

BRIEF DESCRIPTION OF THE DRAWINGS

The embodiments will be described in detail with reference to the following drawings in which like reference numerals refer to like elements wherein:

FIGS. 1 and 2 are conceptual views illustrating a structure of a light conversion substrate according to an embodiment of the present disclosure and a packaging process for a light emitting element;

FIGS. 6 and 7 illustrate conceptual views for a production process of the light conversion substrate according to the embodiment of the present disclosure;

DETAILED DESCRIPTION

Figure 1:
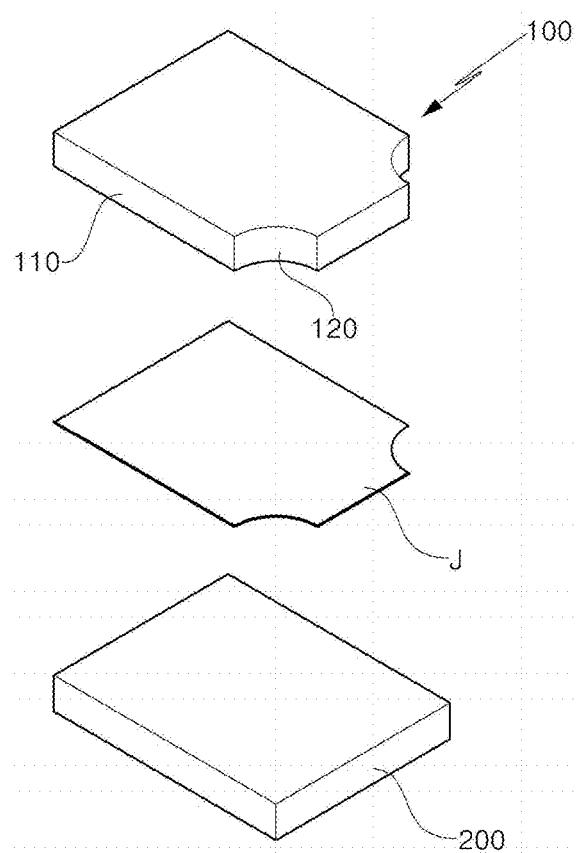

Hereinafter, the configurations and operations according to embodiments of the present disclosure will be described in detail with reference to the accompanying drawings. The present disclosure may, however, be embodied in different forms and should not be construed as limited to the embodiments set forth herein. In the explanation with reference to the accompanying drawings, regardless of reference numerals of the drawings, like numbers refer to like elements through the specification, and repeated explanation thereon is omitted. Terms such as a first term and a second term may be used for explaining various constitutive elements, but the constitutive elements should not be limited to these terms. These terms are only used for the purpose for distinguishing a constitutive element from other constitutive element.

FIGS. 1 and 2 are conceptual views illustrating a structure of a light conversion substrate according to an embodiment of the present disclosure and a packaging process for a light emitting element.

Referring to FIGS. 1 and 2, a light conversion substrate 100 according to the present embodiment of the disclosure may include: a first side part 110 that forms a first taper; and a second side part 120 formed in one region of the light conversion substrate and having a second taper different from the first taper. That is, the side parts of the light conversion substrate may be configured to have each surface having a tapered shape. In particular, illustrated in FIGS. 1 and 2, a portion corresponding to a light emitting surface of a light emitting element, which will be described later, and a hole portion in which wire bonding is performed may be configured to have different tapers.

In particular, the light conversion substrate according to the present embodiment of the disclosure may include a fluorescent material in the inside thereof. A substrate made of a material having various light transmitting properties may be applied as the light conversion substrate. In the present embodiment of the disclosure, a ceramic substrate may be applied.

Also, the fluorescent material contained in the light conversion substrate may include a phosphorescent and fluorescent material so as to convert an excited beam of various light emitting units, for example, a light emitting unit 200 into a conversion beam. Specifically, the fluorescent material may include at least one of a yellow phosphor, a green phosphor, and a red phosphor. The yellow phosphor emits a beam having a main wavelength ranging from 540 to 585 nm in response to a blue beam (having a wavelength ranging from 430 to 480 nm). The green phosphor emits a beam having a main wavelength ranging from 510 to 535 nm in response to the blue beam (having a wavelength ranging from 430 to 480 nm). The red phosphor emits a beam having a main wavelength ranging from 600 to 650 nm in response to the blue beam (having a wavelength ranging from 430 to 480 nm). The yellow phosphor may be a silicate or YAG-based phosphor, the green phosphor may be a silicate, nitride or sulfide-based phosphor, and the red phosphor may be a nitride or sulfide-based phosphor.

Also, the light conversion substrate 100 and the light emitting unit 200 may be mounted to be bonded by an adhesive member J. As illustrated in FIG. 2, the light emitting unit 200 may be mounted on a PCB substrate S and may be packaged.

Figure 3:
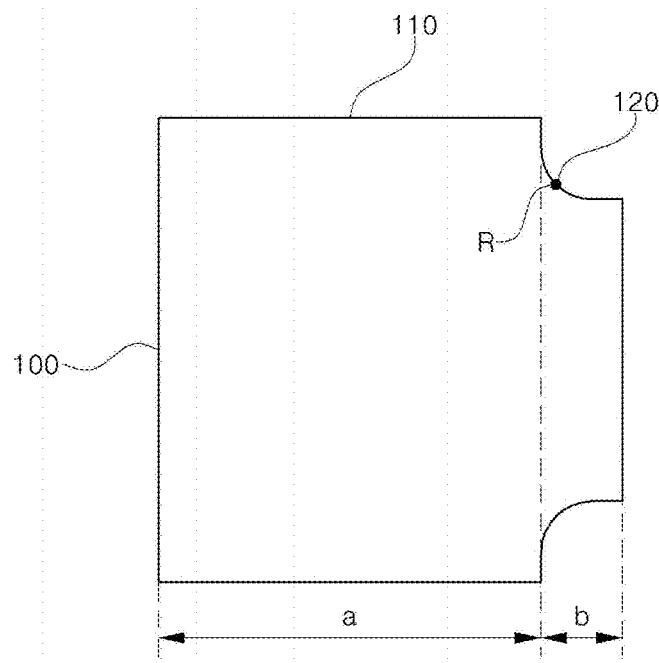
FIGS. 3 and 4 are views illustrating main parts of the light conversion substrate according to the embodiment of the present disclosure.
Figure 4:
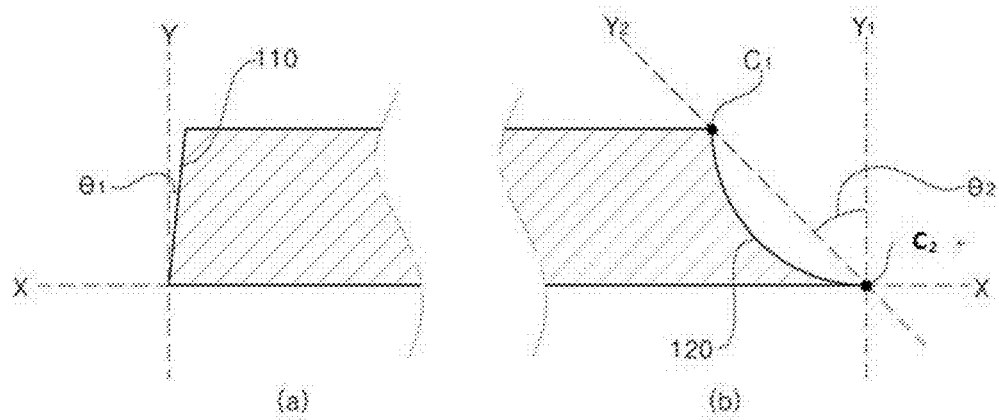

FIGS. 3 and 4 are views illustrating main parts of the light conversion substrate 100 according to the embodiment of the present disclosure.

FIG. 3 illustrates a plan view of the light conversion substrate illustrated in FIG. 1. As illustrated in FIG. 3, the light conversion substrate 100 according to the present embodiment of the disclosure may include: the first side part 110 that forms the first taper; and the second side part 120 having the second taper different from the first taper.

In the case of the first side part 110, as shown in a cross-sectional view of a side illustrated in (A) of FIG. 4, the first taper is defined as an angle θ1 that is formed by an imaginary horizontal plane formed by the first side part, and an imaginary vertical segment Y taken from a lower end point A1 of the first side part to a vertical upper direction. In the present embodiment of the disclosure, the angle θ1 may be formed in the range of 30° or less. When the angle θ1 is more than 30°, a difference in thicknesses generated between an edge portion and a central portion of the light conversion substrate upon implementing the light emitting package illustrated in FIG. 1 is increased. Thus, a difference in color distribution is generated between the edge portion and the central portion, so uniform color distribution cannot be implemented.

Also, the second side part 120 serves as a bonding hole region that will be wire-bonded to the light emitting element of a lower portion illustrated in FIG. 1 rather than being implemented as a substantial light emitting region. Even though the taper angle is more than 30°, in terms of luminous intensity uniformity, a large loss is not generated. Accordingly, different processing methods may be applied to the second side part and the first side part so that cutting and processing for a substrate having difficulty in processing such as a ceramic substrate can be efficiently performed.

(B) of FIG. 4 illustrates a side cross-sectional concept view of the second side part 120 of FIG. 3. In this case, the first taper formed by the second side part 120 has a taper surface having a surface curvature. In consideration of this fact, the second taper may be defined as a taper angle θ2 that is formed by an extension line $Y_2$ of an upper end $C_1$ and a lower end $C_2$ of the second side part having the curvature and a vertical segment $Y_1$. The second taper θ2 may be formed larger than the first taper and may have a taper angle of 30° or more. In particular, in the present embodiment of the disclosure, the second side part 120 may be implemented such that a surface of the second side part has a curvature. Referring to the upper plan view of FIG. 3, the second side part 120 may be implemented to be inwardly curved from an edge portion of the light conversion substrate to a central portion of the light conversion substrate. The second side part having such a structure may be configured such that two second side parts are formed at both edge portions of the light conversion substrate. However, this is only one example, and the second side part may be implemented in one number or plural numbers.

Figure 5:
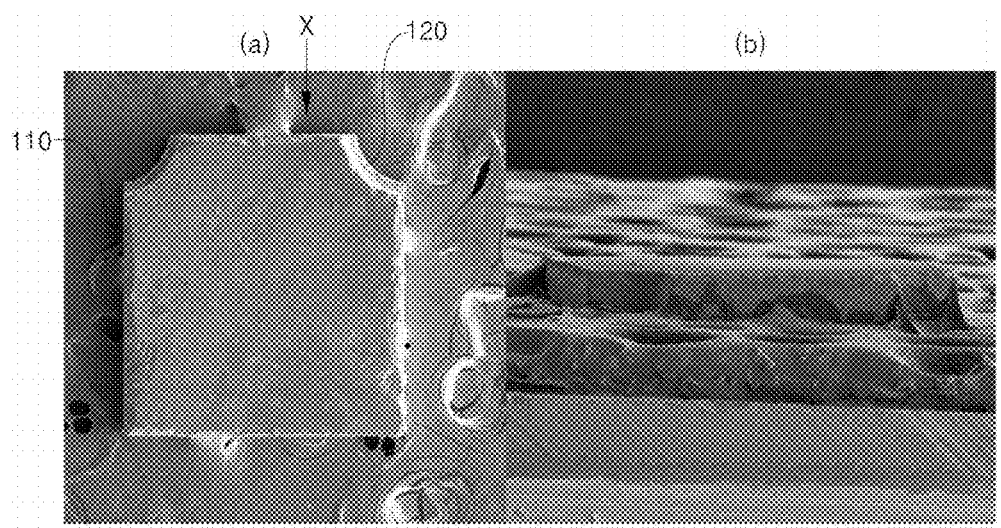
FIG. 5 shows an upper plane image of the light conversion substrate of FIGS. 3 and 4, and a plane image of the light conversion substrate as viewed from an 'x' direction.

(A) of FIG. 5 shows an upper plane image of the light conversion substrate of FIGS. 3 and 4, and (B) of FIG. 5 shows a plane image of the light conversion substrate as viewed from an 'x' direction of (A). As shown in FIG. 5, the second side part has a second taper structure in which a taper is only formed in a wire hole portion. Since the first side par has a very small taper, the first side part is implemented in a subvertical form. Thus, an edge portion of the first side part has a uniform thickness so that luminous intensity uniformity can be secured.

Figure 6:
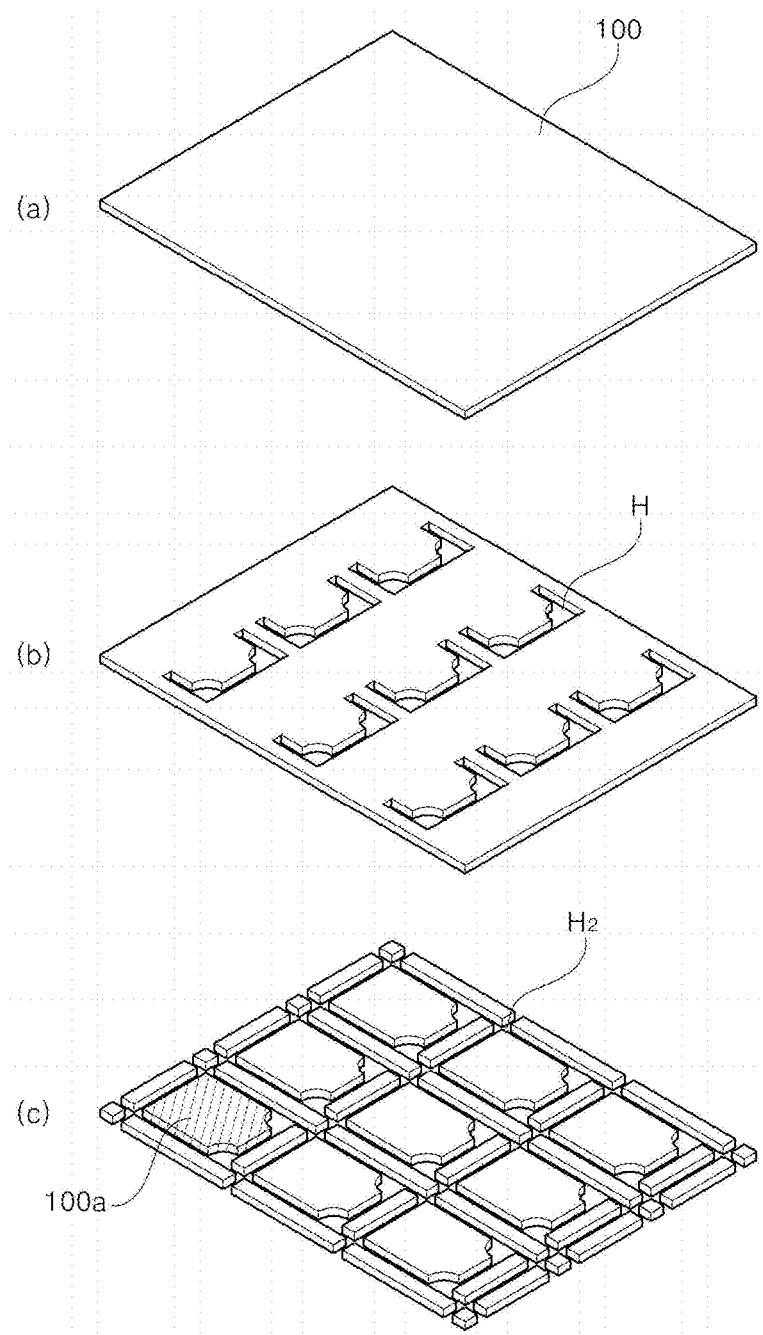

FIGS. 6 and 7 illustrate conceptual views for a production process of the light conversion substrate according to the embodiment of the present disclosure.

In order to implement a property of making a high temperature and high humidity environment bearable, a ceramic substrate may be applied as the light conversion substrate applied to the present embodiment of the disclosure. In consideration of brittleness of the ceramic substrate that enables the ceramic substrate to be easily broken upon processing, there is a need to process the ceramic substrate so that the substrate can entirely have a uniform thickness, thereby facilitating a precise cutting process. That is, it is not easy to perform a cutting process in terms of the property of the ceramic material having brittleness. In particular, it is very difficult to perform the cutting process based on precise patterns via wire bonding.

Thus, when a laser process is carried out, a fluorescent material contained in the inside of the ceramic substrate causes burning by absorbing a laser beam, so a cutting surface of the ceramic substrate is blackened, and a phosphor is deteriorated around the cutting surface. Accordingly, the problem of a reduction in optical properties is generated.

Also, when the ceramic substrate according to the present embodiment of the disclosure is processed by a method such as a chemical etching method, a sandblast method, and the like for package mounting, a difference in color distribution between an edge portion and a central portion of the ceramic phosphor plate occurs because a thickness of the edge portion having a taper portion is not uniform. Furthermore, the amounts of adhesives used in the edge portion and the central portion of the ceramic phosphor plate are different from each other upon mounting the package, so a defect such as bending or warping of the substrate may be generated during a curing process.

In the case of the ceramic phosphor plate according to the present embodiment of the disclosure, there is a need to cut the ceramic phosphor plate while entirely maintaining a uniform plate thickness by minimizing a taper angle. Also, the cutting should be performed in such a manner as to minimize damage to the phosphor from the heat.

In particular, with regard to the manufacturing process of the light conversion substrate according to the present embodiment of the disclosure, the light conversion substrate may be implemented in a structure that enables the minimization of each taper angle of edge portions via the process as shown in FIGS. 6 and 7, and securing of luminous intensity uniformity.

Specifically, in order to perform a precise pattern process such as wire bonding and the like, in the present embodiment of the disclosure, as described above with regard to FIG. 3, the second taper of the ceramic substrate according to the present embodiment of the disclosure is formed by an etching process, and the first taper is then formed by a dicing process. In particular, in the case of the etching process, it is preferable to use a wet etching process. In this case, an isotropic etching process is performed as the wet etching process. An etched amount of a region having relatively many exposed portions is gradually increased as etching time passes. Thus, an etched amount of an upper portion of the ceramic substrate is larger than that of a lower portion because the upper portion has a relatively large exposed region compared to that of the lower portion. Accordingly, the second taper having the structure previously described with reference to FIG. 3 may be implemented. Then, the first taper may be implemented by the dicing process.

Explaining a detailed process example with reference to FIG. 6, as shown in (A) of FIG. 6, a substrate 100 is prepared as a raw material of the light conversion substrate, the second taper is implemented by subjecting each part corresponding to the second side parts to hole H processing. This process may be performed by the wet etching process as described above.

Then, each part corresponding to the first side parts is subjected to hole H2 dicing so that a structure of each first side part having the first taper as shown in FIG. 3 can be implemented.

Also, as shown in FIG. 7, holes H3 having each circular cross section are formed in the substrate 100 as shown in (A) and (B) of FIG. 7 by performing the wet etching process. Each Hole is cut in quarters by cutting lines as shown in (C) of FIG. 7. Thus, unit light conversion substrates 100*a* are formed.

Figure 8:
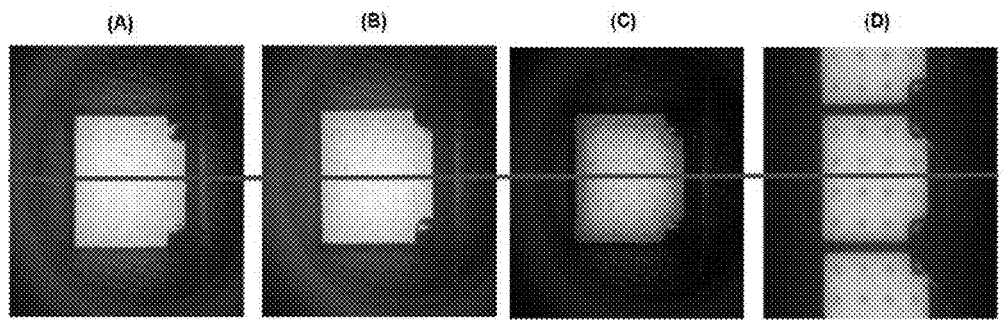
FIG. 8 shows the comparison of variations in edge portions resulting from the production process.

FIG. 8 shows the comparison of variations in edge portions resulting from the production process.

In (A) of FIG. 8, the production method of FIGS. 6 and 7 such as an etching process and a dicing process is applied, in (B) of FIG. 8, a method for performing a dicing process after a laser process is applied, in (C) of FIG. 8, a method for processing the light conversion substrate having the structure of FIG. 3 using only a laser process is applied, and in (D) of FIG. 8, a laser process in a structure containing a phosphor is applied to a resin type substrate rather than a ceramic substrate.

Figure 9:
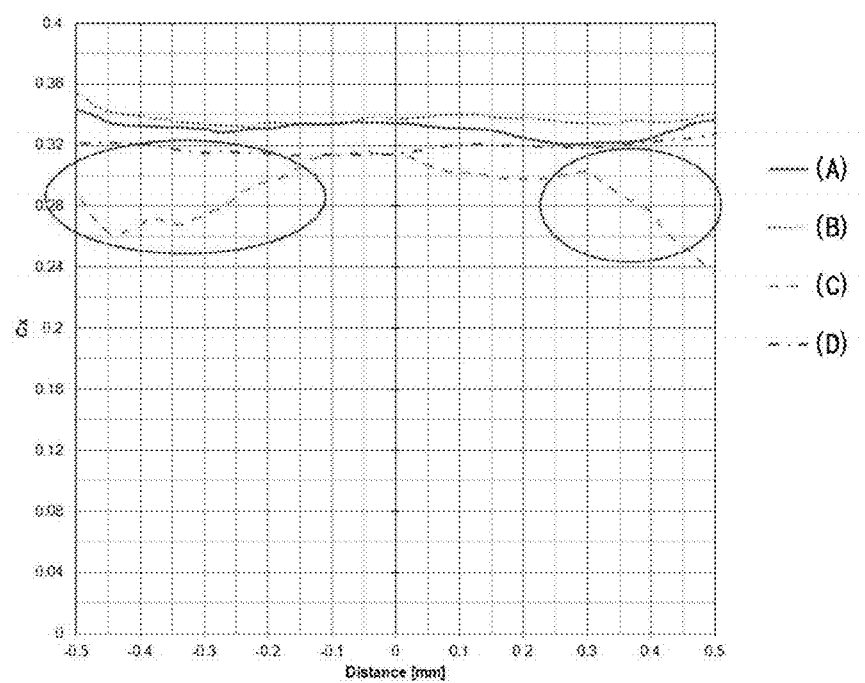
FIGS. 9 and 10 show each variation in color temperatures Cx, Cy resulting from the processing methods of FIG. 8
Figure 10:
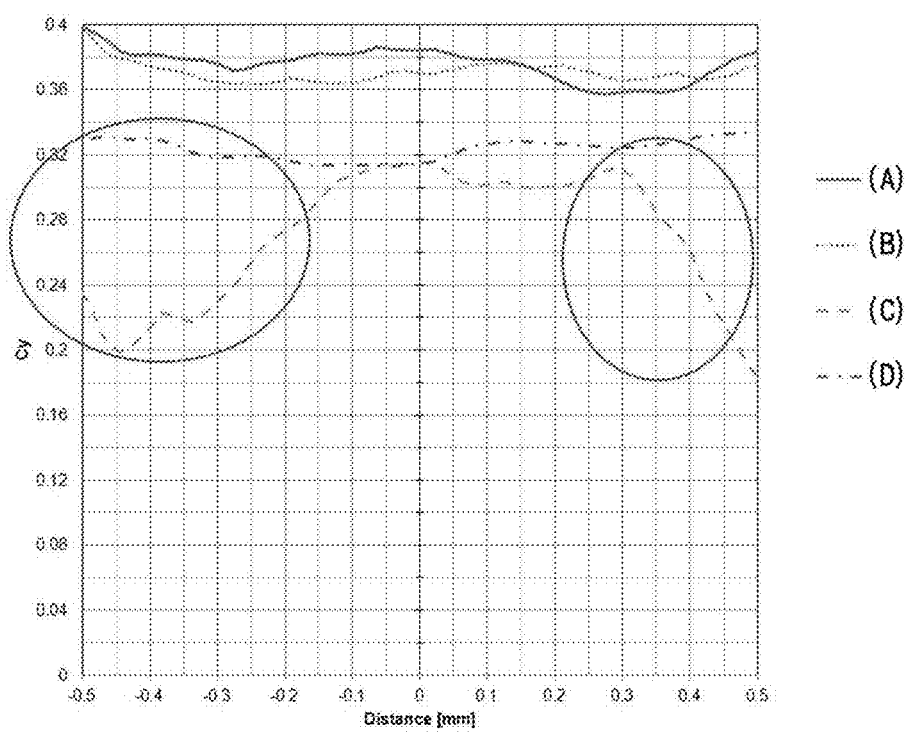

FIGS. 9 and 10 show each variation in color temperatures Cx, Cy resulting from the processing methods of FIG. 8. As illustrated in these drawings, in the case of (D) in which only the laser process is used, it can be seen that a variation in color temperature is seriously generated from an edge portion. It can be confirmed that the (D) type sample processed by only the laser process is excellent in terms of a color coordinate variation, and that the color coordinate variation can be implemented in an equal level as that of the resin type sample of a comparative group.

Figure 11:
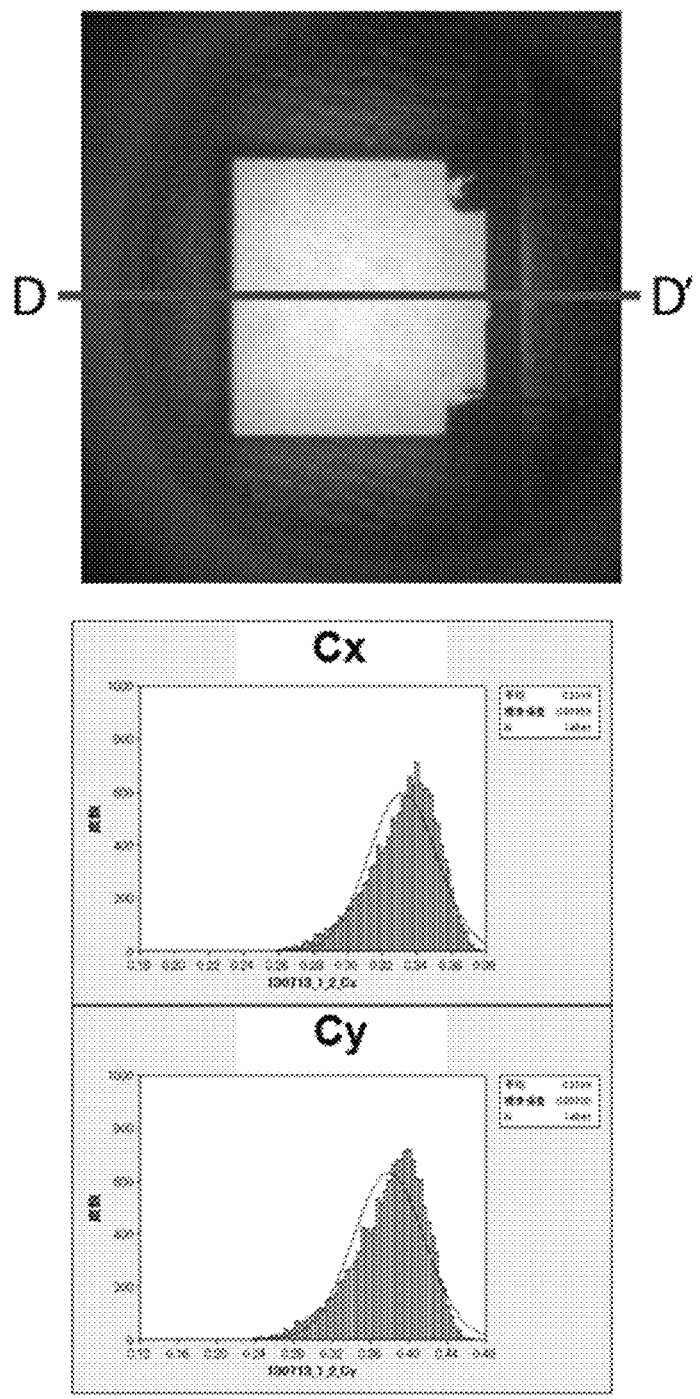
FIGS. 11 to 14 are graphs specifically showing the results of each color coordinate for four samples of FIG. 8.
Figure 12:
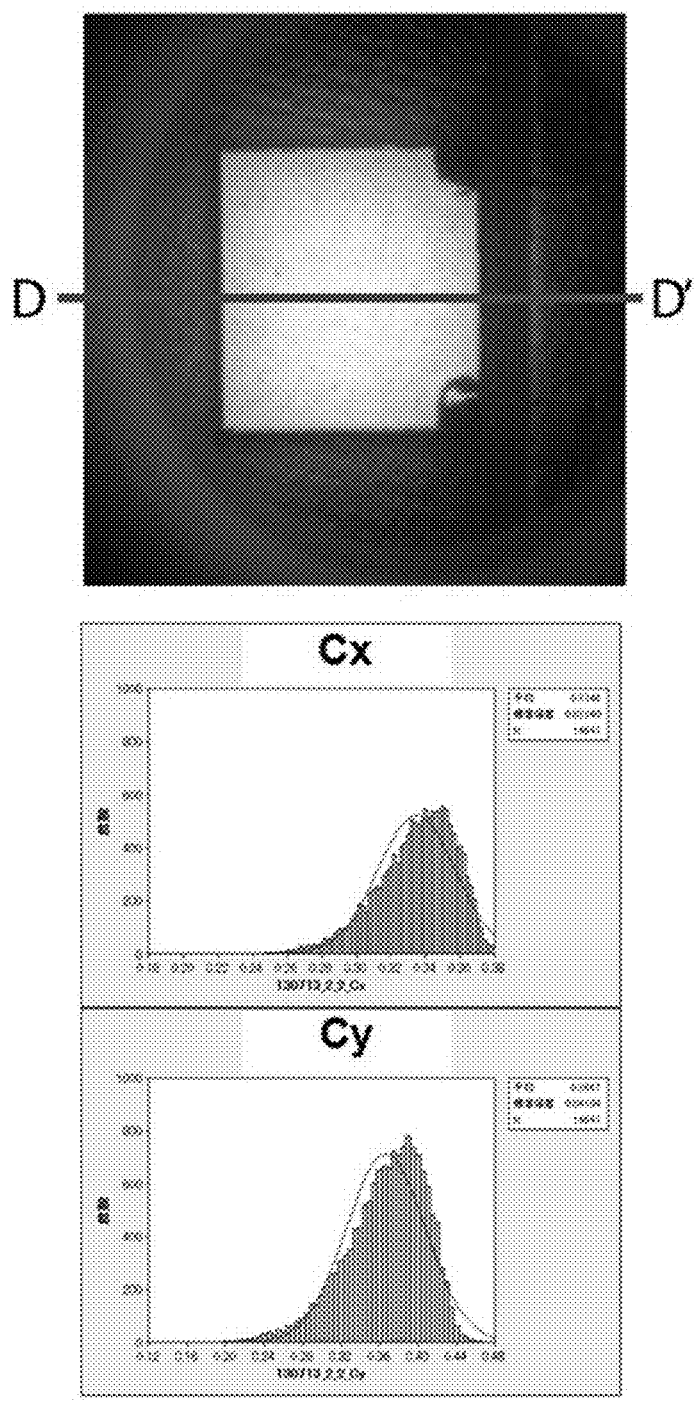
Figure 13:
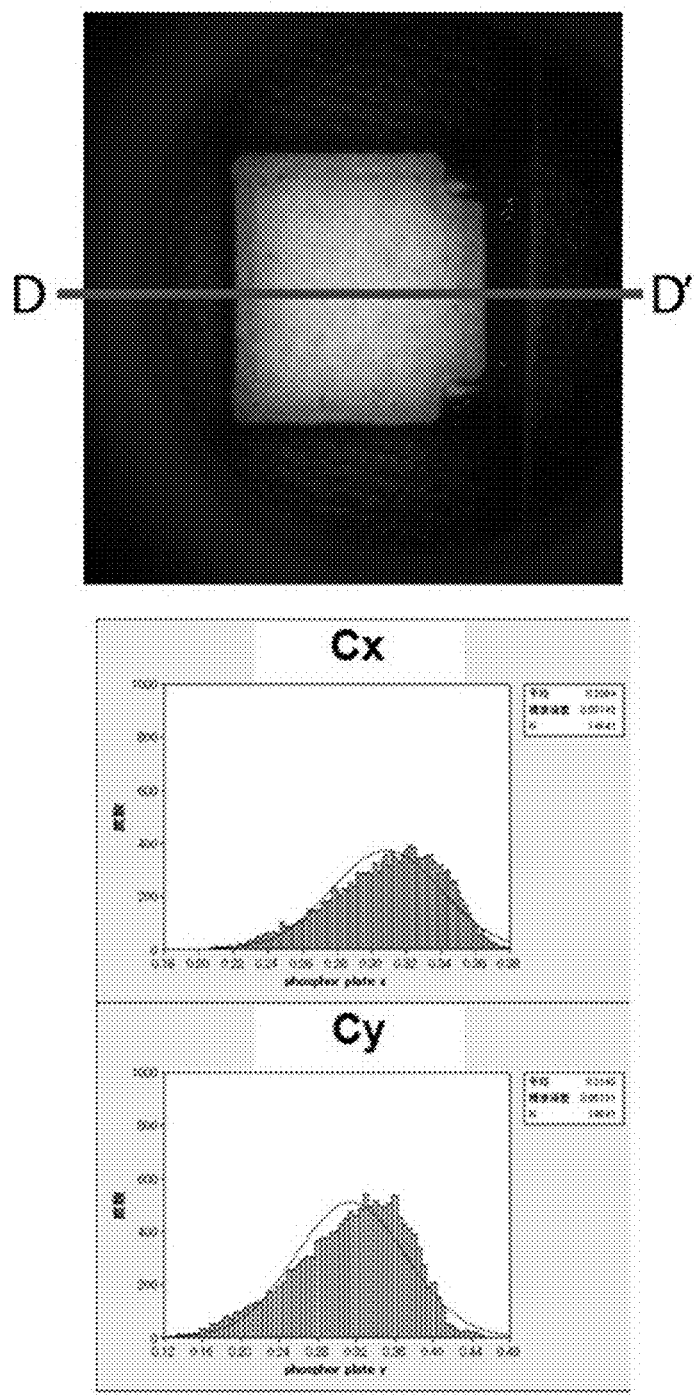
Figure 14:
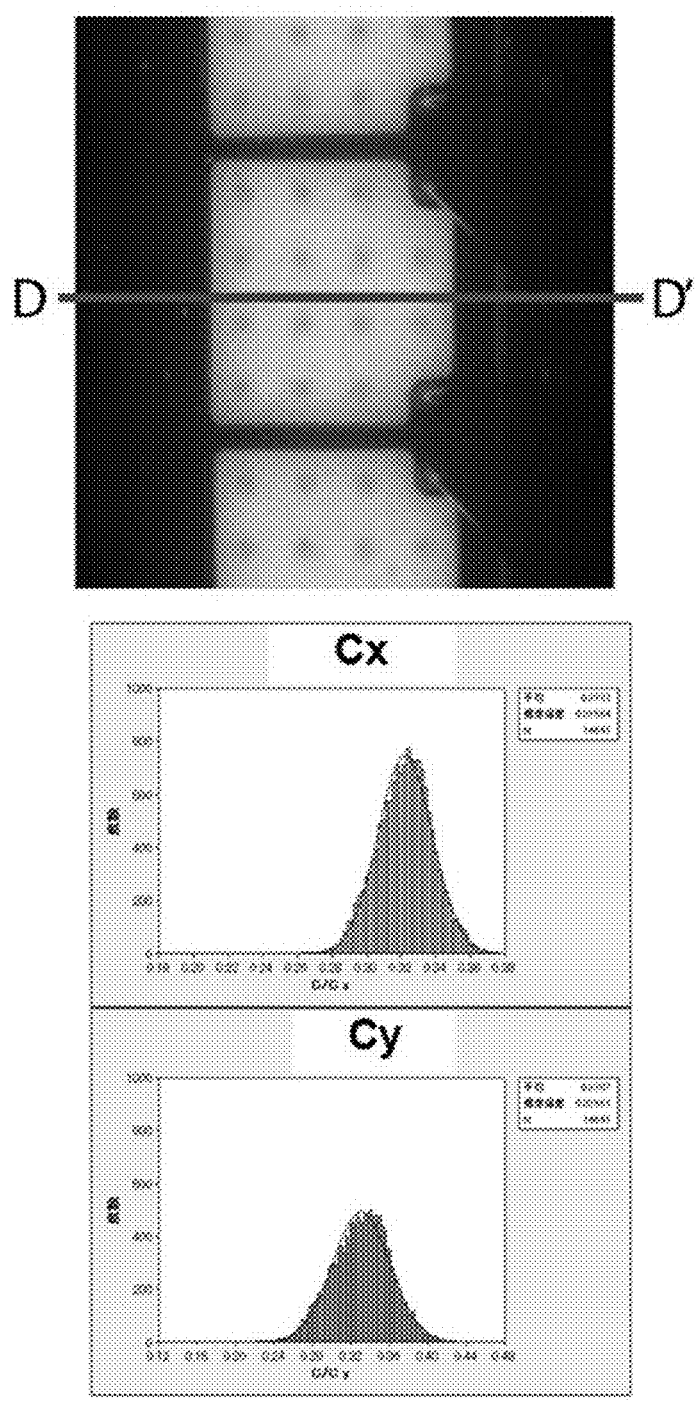

FIGS. 11 to 14 show graphs that specifically present the results of each color coordinate regarding four samples. That is, FIG. 11 illustrates the results of a color coordinate upon processing the (A) type sample of FIG. 8, FIG. 12 illustrates the results of a color coordinate upon processing the (B) type sample of FIG. 8, FIG. 13 illustrates the results of a color coordinate upon processing the (C) type sample of FIG. 8, and FIG. 14 illustrates the results of a color coordinate upon processing the (D) type sample of FIG. 8.

Referring to the results of FIGS. 8 to 14, when the ceramic substrate according to the present embodiment of the disclosure is implemented as the light conversion substrate, the side parts having a structure for enabling securing of maximum luminous intensity uniformity and a structure having a wire bonding region may be secured.

Also, through the result of FIG. 9, it can be seen that the light conversion substrate according to the present embodiment of the disclosure, which implements an equal color coordinate to that of the (D) type sample, namely, the resin type sample, may be implemented as a ceramic phosphor substrate having equal color coordinate performance to that of the light conversion substrate having strong tolerance compared to the resin type substrate upon applying high electric currents.

Figure 15:
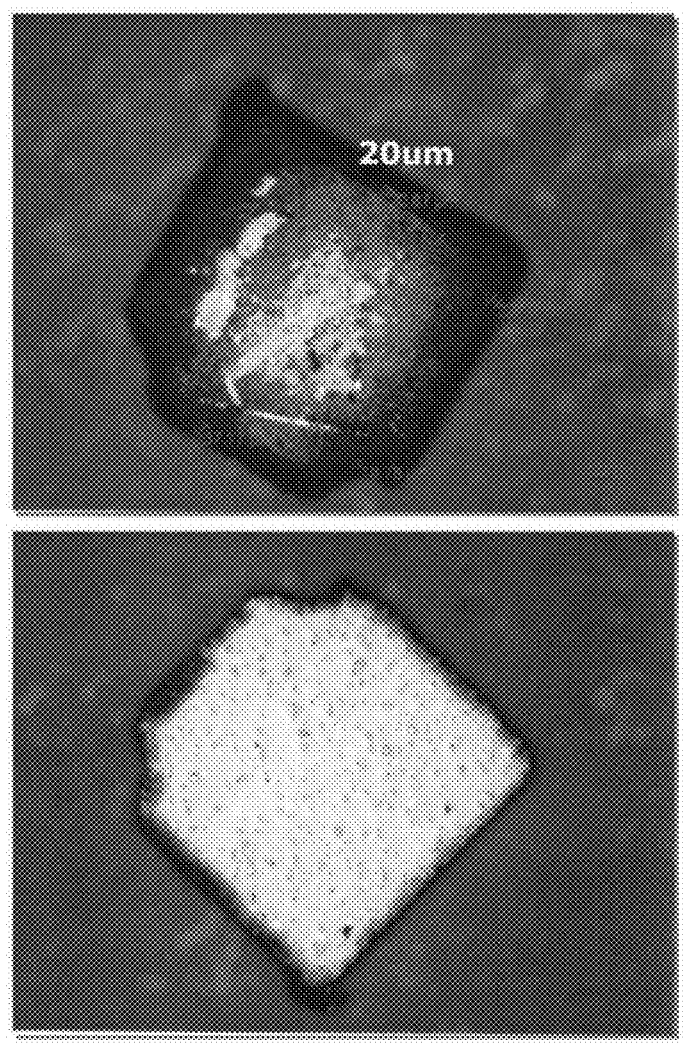
FIGS. 15 to 17 are images showing problems caused by various laser processes.
Figure 16:
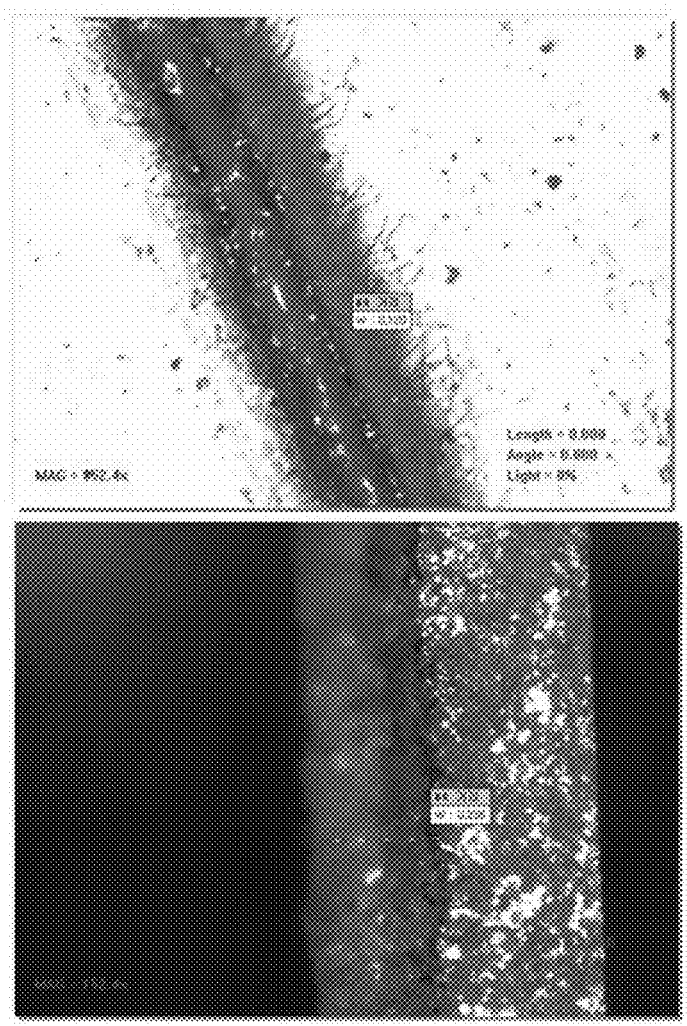
Figure 17:
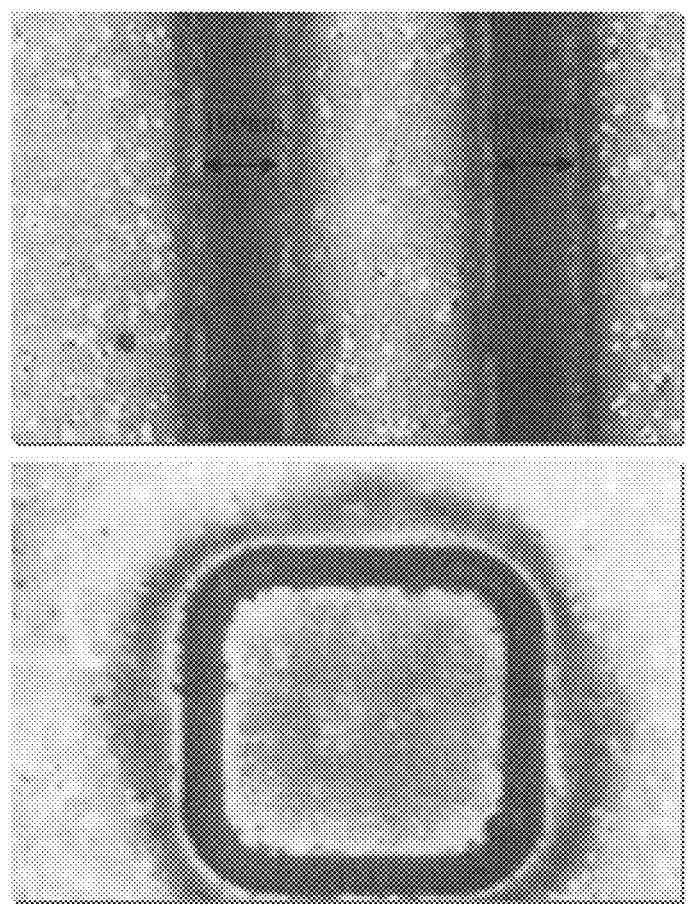

FIG. 15 is an actual image photo of the light conversion substrate showing a reduction in optical properties resulting from burning of an edge portion due to the absorption of a laser beam by a phosphor and degradation of the phosphor around a cutting surface when the light conversion substrate having the structure of FIG. 3 according to the present embodiment of the disclosure is implemented by only the laser (Pico UV laser) process using a ceramic substrate containing the phosphor. FIG. 16 shows an image resulting from a case in which the ceramic substrate is processed by a green laser, and FIG. 17 shows an image resulting from a case in which the ceramic substrate according to the present embodiment of the disclosure is processed by an Nd:YAG laser. Thus, it can be confirmed that the same problem as that of FIG. 15 is generated.

Accordingly, the light conversion substrate according to the present embodiment of the disclosure may be manufactured in a structure in which mechanical processing can be applied so that degradation of the side parts can be minimized and optical efficiency can be increased. Thus, a special structure, which is formed different from that of a wire bonding region for the tapers of the side parts, is implemented so that the light conversion substrate having excellent optical properties can be implemented and can be packaged by a combination with a light emitting element.

As previously described with reference to FIGS. 1 and 2, the light conversion substrate according to the present embodiment of the disclosure may be implemented as a lighting device that is packaged by a combination with the light emitting element.

In particular, in consideration of the light emitting package having a structure as shown in FIG. 2, the light conversion substrate according to the present embodiment of the disclosure may be implemented as a light conversion substrate having a structure in which a fluorescent material is contained in a ceramic substrate so that degradation of the edge portion can be prevented, and luminous intensity uniformity can be increased. Furthermore, as illustrated in FIG. 18, an optical selective member 300 is formed on one surface of the light conversion substrate 100 so that an excited beam emitted from the light emitting element 200 can be converted into a conversion beam via the light conversion substrate 100, and the conversion beam is partially reflected from the optical selective member in a fixed direction so that packaging can be performed, thereby enabling an increase in light efficiency.

Figure 18:
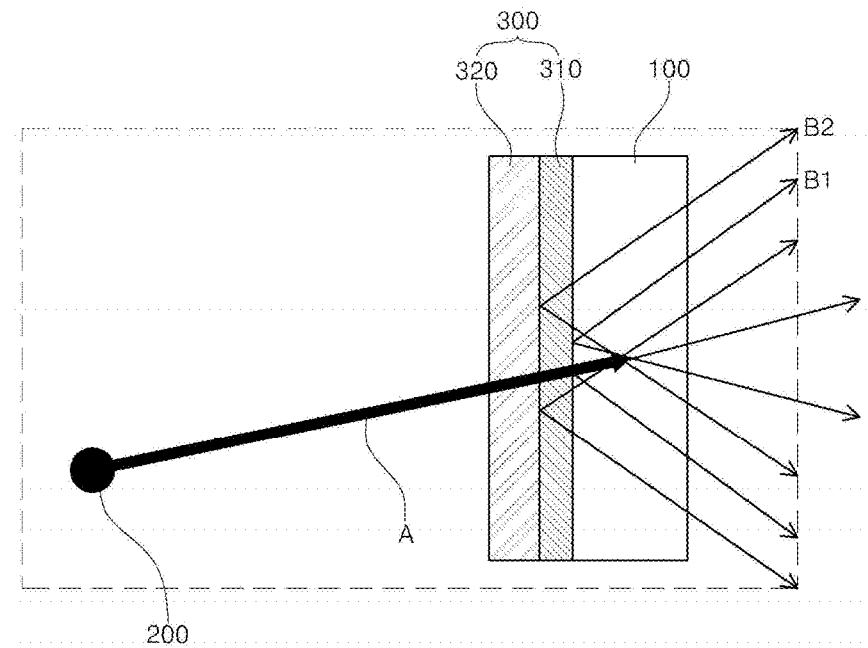
FIGS. 18 and 19 illustrate examples to which the light conversion substrate according to the embodiment of the present disclosure is applied.

That is, the structure of FIG. 18 may be implemented as a package as shown in FIG. 2.

Specifically, referring to FIG. 18, the light conversion substrate 100 according to the other embodiment of the present disclosure is disposed to be adjacent to the light emitting element 200 so as to partially transmit a beam A flowing into the light conversion substrate, and the light conversion substrate 100 may further include the optical selective member 300 intended for reflecting some conversion beams B1, B2 of conversion beams converted from the light conversion substrate 100.

As described above, the light conversion substrate 100 may basically have a structure in which that an metal oxide is contained in a light conversion member containing a fluorescent material (phosphor) so that scattering of light can be increased and optical efficiency can be improved.

In addition to this, when the optical selective member 300 is additionally formed in a specific direction, a beam entering from one direction may be transmitted so as to enter the light conversion substrate 100 so that scattering and converting of the beam can be implemented by the fluorescent material and the metal oxide contained in the light conversion substrate. Furthermore, by reflecting beams leaked in a light incidence direction among beams emitted in all directions again, the beams may be collected in one direction.

The light conversion substrate 100 may be disposed in an optical path of the excited beam emitted from the light emitting unit 200 and may function to form a conversion beam B by absorbing, exciting and emitting the excited beam. To do so, the light conversion substrate 100 may contain a luminescent material (lumiphor), and may further contain a metal oxide so that a scattering rate of light can be increased. The light emitting unit 200 may include a light emitting element emitting a beam and may cover various light sources. As one example, a solid light emitting element may be applied as the light emitting unit. The solid light emitting element may be any one selected from the group consisting of an LED (Light Emitting Diode), an OLED (Organic Light Emitting Diode), an LD (Laser Diode), a laser, and a VCSEL (Vertical Cavity Surface Emitting Laser).

As one example, the light conversion substrate 100 may be formed in a plate form as illustrated in FIG. 18 and may be disposed at a spaced position which light excited from the light emitting unit 200 can reach. In this case, a space part may be formed between the light conversion substrate 100 and the light emitting unit 200. The light conversion substrate 100 may function to convert an excited beam having a low wavelength emitted in a thin spectrum width created from the light emitting unit 200 into a white beam, thereby forming a conversion beam B. Also, as illustrated in FIG. 18, the conversion beam B converted from the light conversion substrate 100 may be emitted in all directions based on a central point of the light conversion substrate 100. At this time, the conversion beam B emitted in all directions is reflected from the optical selective member 300 which will be described later so that an optical path can be controlled in a specific direction.

In particular, the optical selective member 300 may be spaced apart from the light emitting unit 200. The light conversion substrate 100 and the optical selective member 300 may be formed to be directly closely attached to each other, or may be formed to be spaced apart from each other. In either case, when the conversion beam B flowing into the light conversion substrate 100 and converted is emitted in all directions, the optical selective member 300 may control a direction of the beam to a fixed direction via reflection.

For example, in the structure illustrated in FIG. 18, the optical selective member 300 may be formed to be closely attached to an entire surface of the light conversion substrate 100, or may be formed on a part of the surface of the light conversion substrate. Furthermore, the optical selective member 300 may be formed to be adjacent to one surface of the light conversion substrate 200. In particular, the optical selective member 300 may be formed in a structure in which at least two material layers 310, 320 having different refractive indexes are laminated. That is, the optical selective member 300 may be implemented such that the material layers having the different refractive indexes are laminated in a multilayered structure. In this case, with regard to the lamination structure, only the lamination of a thin film structure is exemplified, but the lamination structure may be also implemented as a lamination structure of a thin film layer having a periodical grid form or a thin film layer having a regular pattern structure. This lamination structure may increase reflectance of the conversion beams converted from the light conversion substrate 100 and may enable light transmittance to be easily adjusted so that efficient light intensity can be implemented.

The structure illustrated in FIG. 18 shows a case in which two layered thin film structures are laminated on a surface of the light conversion substrate 100, namely, a surface facing the light emitting unit 200. In such a case, the optical selective member 300 may be implemented a lamination structure composed the first material layer 310 having the first refractive index and the second material layer 320 having the second refractive index. In particular, the refractive index of the first material layer 310 is different from that of the second material layer 320. In particular, the first and second material layers may be formed to have a difference in the refractive indexes of 0.1 or more. When the difference in the refractive indexes is less than 0.1, reflectance as the lamination structure is reduced, and it is difficult to control transmittance and to implement specialty of the lamination structure.

Also, referring to FIG. 18, in the other embodiment of the present disclosure, the lamination of the material layers may be variously performed in such a manner that two layered material layers having different refractive indexes are implemented in a multi-layered structure. Preferably, the first material layer 310 and the second material layer 320 having a difference in refractive indexes of 0.1 or more may be alternatively laminated. Such a structure enables an increase in reflectance and is very useful in terms of light control. That is, the optical selective member 300 formed in the multi-layered structure may enable the transmittance of a central wavelength I_max of the excited beam flowing into the light conversion substrate 100 to be increased by 70% or more and may also enable a reflectance of the conversion beam B converted in the inside of the optical selective member 300 to be increased by 60% or more of a main wavelength of the conversion beam.

As an example for this, in one embodiment of the present disclosure, when the first material layer 310 and the second material layer 320 are alternatively laminated, the lamination structure may be implemented in five or more layers. In order to make the device thinner, the lamination structure may be implemented in five or more layers and thirty or less layers. To do so, the optical selective member 300 may be produced by forming a thin film in the form of $[(L/2)H(L/2)]^S$ and may be made of a material having excellent reflectance and transmittance such as $TiO^2$, $SiO^2$ and the like. The laminating method may be performed by a sputtering process, a deposition process, a dipping process, a spray coating process, or the like.

Also, in addition to the structure in which the optical selective member 300 is directly laminated on the surface of the light conversion substrate 100, a substrate of an individual structure may be adhered to the light conversion substrate 100 via a light transmitting adhesive member, and a separate thin film structure may be implemented on the substrate using a sputtering process, a deposition process, a dipping process, a spray coating process or the like.

All light transmitting substrates may be applied as the substrate. The adhesive member, which is a transparent polymeric sheet, may be made of any one of PMMA (Polymethly methacrylate), A-PET (Amorphous Polyethylene terephthalate), PETG (Poly(ethylene terephthalate)-glycol), and PC (Polycarbonate). In addition to this, if any material has good light transmitting performance, the material may be used as the material of the adhesive member.

Also, when implementing the light conversion substrate 100 according to the present embodiment of the disclosure, a metal oxide may be further contained in the inside of the light conversion substrate. In particular, the metal oxide may be added in an amount of 0.1~10 wt % based on the total weight of the light conversion substrate. This metal oxide may enable an incident beam to be implemented as a scattering beam scattered in the inside of the light conversion substrate, and may enable the scattering beam to be converted into various beams via a phosphor. Thus, a haze of the light conversion substrate may be increased, and light efficiency may be also increased. Furthermore, a blue spot and the like caused by the light emitting unit emitting strong beams may be removed. Also, the scattering effect of light may function to enable the light to be uniformly distributed. Moreover, when the amount of the metal oxide contained in the light conversion substrate is less than 0.1 wt %, the effect of the increase in haze may not be expected. When the amount of the metal oxide contained in the light conversion substrate is more than 10 wt %, the light conversion substrate may have lower light efficiency than that of a glass substrate which is a glass frit sintering body. This reason is because transmittance is very reduced.

As one example for implementing this light conversion substrate, a sintering body composed of a glass frit is prepared, and a light conversion member containing a phosphor is provided in a substrate form. Furthermore, the light conversion substrate may contain any one selected from the group consisting of $Al_2O_3$, $TiO_2$, and ZnO, or a mixture thereof.

Figure 19:
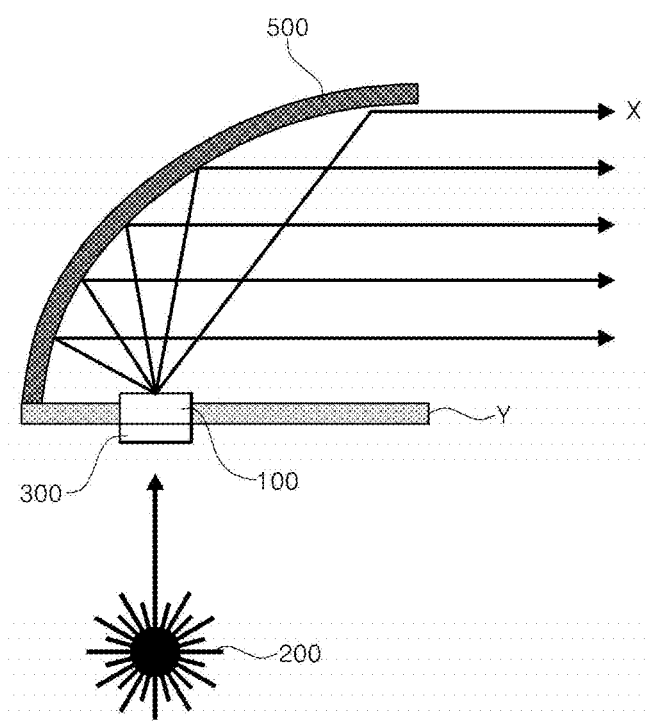

FIG. 19 is a conceptual view illustrating a structure in which a light emitting package having the light conversion substrate 100 according to the embodiment of the present disclosure and the optical selective member 300 is applied to a head lamp for an automobile.

The beam emitted from the light emitting unit 200 is converted into conversion beams by the light conversion substrate 100, and some conversion beams travel to a reflector 500. Some conversion beams traveling toward the light emitting unit are reflective by the optical selective member 300 and return to the reflector 500 again, and thus being emitted X. Thus, a head lamp capable of improving optical confinement and increasing light conversion efficiency may be implemented. Also, the element of the optical selective part formed in a slimming structure may be only implemented by locally installing it in a structure such as a housing Y and the like, and thus a size of the lamp housing may be entirely reduced.

As set forth above, according to some embodiments of the present disclosure, the light conversion substrate may be configured such that the side parts of the light conversion substrate for converting the beam emitted from the light emitting element are formed to have different taper angles so that uniform color distribution can be implemented all over the entire area of the light conversion substrate upon packaging the light emitting element and the light conversion substrate.

In particular, according to some embodiments of the present disclosure, the tapers formed at the sides of the light conversion substrate may be adjusted so that a ratio of the materials for adhesion with the light emitting element can be uniformly formed, thereby implementing the light emitting package having a combination structure with reliability.

Also, according to some embodiments of the present disclosure, the metal oxide may be injected into the light conversion substrate containing a phosphor so that a haze of the light conversion substrate can be increased, thereby enabling an increase in light efficiency.

In particular, in addition to the increase in light efficiency resulting from the addition of the metal oxide such as $Al_2O_3$, $TiO_2$, ZnO and the like, a factor (i.e., blue spot) causing a reduction of color uniformity of the light emitting unit is also removed so that the beam emitted from the light conversion plate can have uniform color temperatures.

Furthermore, by applying the light conversion substrate according to some embodiment of the present disclosure, the optical selective part is formed on the surface of the light conversion substrate or at a position adjacent to the light conversion substrate so that light transmittance of a light source incident to the light conversion substrate can be increased, and the light can be controlled from returning to a light incident direction, thereby enabling a reduction in the level of difficulty for a system optical design.

Also, conversion beams converted by the light conversion substrate emitted in all directions are controlled so that an output of the conversion beams in a specific direction can be increased, and thus the efficiency of an automobile lamp system can be improved.

As previously described, in the detailed description of the disclosure, having described the detailed exemplary embodiments of the disclosure, it should be apparent that modifications and variations can be made by persons skilled without deviating from the spirit or scope of the disclosure. Therefore, it is to be understood that the foregoing is illustrative of the present disclosure and is not to be construed as limited to the specific embodiments disclosed, and that modifications to the disclosed embodiments, as well as other embodiments, are intended to be included within the scope of the appended claims and their equivalents.

The present disclosure has been made keeping in mind the above problems, an aspect of embodiments of the present disclosure provides a light conversion substrate which is configured such that side parts of the light conversion substrate for converting a beam emitted from a light emitting element are formed to have different taper angles so that uniform color distribution can be implemented all over the entire area of the light conversion substrate.

According to an aspect of embodiments of the present disclosure, a light conversion substrate may include: a first side part that forms a first taper; and a second side part formed in one region of the light conversion substrate and having a second taper different from the first taper, wherein the light conversion substrate contains a fluorescent material.

Also, according to another aspect of embodiments of the present disclosure, a light emitting package may include the light conversion substrate; and a light emitting unit emitting a beam to the light conversion substrate. This light emitting package may be applied to a lighting device such as an automobile lamp and the like.

Any reference in this specification to "one embodiment," "an embodiment," "example embodiment," etc., means that a particular feature, structure, or characteristic described in connection with the embodiment is included in at least one embodiment of the disclosure. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting package, comprising:
a light emitting unit emitting an excited beam; and
a light conversion substrate disposed on the light emitting unit,
wherein the light conversion substrate comprises:
a first side part having a first taper; and
a second side part disposed on an edge portion of the light conversion substrate and having a second taper different from the first taper, wherein the second side part exposes a connection terminal of the light emitting unit,
wherein the first taper has a straight line connecting to an upper end and a lower end of the first side part and the second taper has a curved line connecting to an upper end and a lower end of the second side part,
wherein the first taper and second taper are inclined so that an area of the light conversion substrate decreases in the direction away from the light emitting unit,
wherein an angle of the second taper is larger than an angle of the first taper,
wherein the angle of first taper is an angle between the straight line and a vertical segment extending in a vertical direction from the lower end point of the first side part,
wherein the angle of second taper is an angle between an virtual straight line and a vertical segment extending in a vertical direction from the lower end of the second side part, and
wherein the virtual straight line connects the upper end and the lower end of the second side part.

2. The light emitting package of claim 1, wherein the first taper has an angle of 30° or less, and the second taper has an angle of 30° or more.

3. The light emitting package of claim 1, wherein the light conversion substrate is a ceramic substrate containing a phosphor, and wherein the ceramic substrate further contains a metal oxide.

4. The light emitting package of claim 1, wherein the second taper is formed by using an etching process and the first taper is formed by using a dicing process.

5. The light emitting package of claim 2, wherein a position where the second side part is provided is inwardly curved and corresponds to a connection terminal of the light emitting element.

6. The light emitting package of claim 5, further comprising an adhesive member disposed between the light emitting unit and the light conversion substrate and an optical selective member that transmits beams having several wavelengths and flowing into the light conversion substrate to a surface facing the light emitting unit to partially reflects conversion beams converted by the light conversion substrate.

7. The light emitting package of claim 6, wherein the optical selective member is disposed to be adjacent to one surface of the light conversion substrate, and has a structure in which at least two material layers having different refractive indexes are laminated, and
wherein a difference in refractive indexes for ones of the material layers laminated to be adjacent to each other is 0.1 or more.

8. An automobile lamp, comprising:
a light emitting package; and
a reflective module that reflects a conversion beam passing through a light conversion substrate for converting an excited beam emitted from a light emitting unit of the light emitting package into the conversion beam,
wherein the light emitting package comprises:
a light conversion substrate disposed on the light emitting unit,
wherein the light conversion substrate comprises:
a first side part having a first taper; and
a second side part disposed on an edge portion of the light conversion substrate and having a second taper different from the first taper, wherein the second side part exposes a connection terminal of the light emitting unit,
wherein the first taper has a straight line connecting to an upper end and a lower end of the first side part and the second taper has a curved line connecting to an upper end and a lower end of the second side part,
wherein the first taper and second taper are inclined so that an area of the light conversion substrate decreases in the direction away from the light emitting unit,
wherein an angle of the second taper is larger than an angle of the first taper,
wherein the angle of first taper is an angle between the straight line and a vertical segment extending in a vertical direction from the lower end point of the first side part,
wherein the angle of second taper is an angle between an virtual straight line and a vertical segment extending in a vertical direction of the lower end of the second side part, and
wherein the virtual straight line connects the upper end and the lower end of the second side part.

9. The automobile lamp of claim 8, wherein the second taper is formed by using an etching process and the first taper is formed by using a dicing process.

10. The automobile lamp of claim 8, wherein the angle of the first taper has an angle of 30° or less, and the angle of the second taper has an angle of 30° or more.

11. The automobile lamp of claim 10, wherein a position where the second side part is provided is inwardly curved and corresponds to the connection terminal of the light emitting element.

* * * * *